United States Patent

Ramirez

(10) Patent No.: US 9,146,135 B2
(45) Date of Patent: Sep. 29, 2015

(54) METER DISPLAY DURING POWER INTERRUPTION

(71) Applicant: Landis+Gyr, Inc., Lafayette, IN (US)

(72) Inventor: Anibal Diego Ramirez, Indianapolis, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 316 days.

(21) Appl. No.: 13/631,431

(22) Filed: Sep. 28, 2012

(65) Prior Publication Data

US 2014/0091946 A1 Apr. 3, 2014

(51) Int. Cl.
- G08B 23/00 (2006.01)
- G01D 4/02 (2006.01)
- G01R 11/24 (2006.01)
- G01D 4/00 (2006.01)

(52) U.S. Cl.
CPC .. *G01D 4/02* (2013.01); *G01D 4/00* (2013.01); *G01R 11/24* (2013.01); *Y04S 20/36* (2013.01)

(58) Field of Classification Search
CPC ........... G01D 4/00; G01R 11/24; Y04S 20/36
See application file for complete search history.

(56) References Cited

U.S. PATENT DOCUMENTS

| | | | | |
|---|---|---|---|---|
| 4,707,679 | A | * | 11/1987 | Kennon et al. ............ 340/538 |
| 2003/0111911 | A1 | * | 6/2003 | Hsu ........................... 307/141 |
| 2006/0091877 | A1 | * | 5/2006 | Robinson et al. ......... 324/76.11 |
| 2012/0096373 | A1 | * | 4/2012 | Aguera Y Arcas et al. ... 715/764 |

* cited by examiner

*Primary Examiner* — Steven Lim
*Assistant Examiner* — Omeed Alizada
(74) *Attorney, Agent, or Firm* — Maginot, Moore & Beck LLP

(57) ABSTRACT

A circuit arrangement for use in a utility meter includes a processing circuit, a magnetically-actuated switch, and a first circuit. The processing circuit has a first mode and a second mode. The processing circuit performs a first set of metering operations related to energy metering in the first mode, and a second set of operations in the second mode or sleep mode. The second set of operations has fewer operations than the first set of operation, and requires less energy. The switch has is coupled to provide a first output signal to the processing circuit. The first circuit is configured to generate a pulse signal responsive to the switch transitioning states, and is operably coupled to provide the pulse signal to the processing circuit. The processing circuit causes display of stored values responsive to receiving the pulse and receiving the first output signal.

20 Claims, 7 Drawing Sheets

METER DISPLAY DURING POWER INTERRUPTION

FIELD OF THE INVENTION

The present invention relates generally to utility meters, and more specifically, to utility meters having displays.

BACKGROUND OF THE INVENTION

Electrical service providers such as electrical utilities employ electricity meters to monitor energy consumption by customers (or other entities). Electricity meters track the amount of energy consumed by a load (e.g. the customer), typically measured in kilowatt-hours ("kwh"), at each customer's facility. The service provider uses the consumption information primarily for billing, but also for resource allocation planning and other purposes.

Many current electricity meters use digital circuitry to determine energy consumption and other billing values. For example, it is known to digital signal processors to calculate energy consumption from digital energy measurement signals. The calculated consumption information is then displayed on a meter display. From time to time, a meter reader from the utility obtains the consumption information displayed on the customer's meter display, thereby enabling billing. In the alternative, or in addition, the meter may include transmission capabilities for transmitting consumption information to a remote utility computing device, thereby also enabling billing.

Electrical power is transmitted and delivered to load in many forms. For example, electrical power may be delivered as polyphase wye-connected or delta-connected power or as single phase power. Such various forms are known as service types. Different standard electricity meter types, known as meter forms, are used to measure the power consumption for the various service types. The commonly used meter forms in the United States include those designated as 2S, 3S, 5S, 45S, 6S, 36S, 9S, 16S, 12S and 25S meter forms, which are well known in the art.

A primary purpose of metering is to allow a utility to obtain information regarding the energy usage by a load (customer) for the purposes of accurate billing and/or planning. To this end, meters employ multiple methods of communicating energy usage (and other) information. The methods of communication include displaying meter values at the meter location, communicating meter values in locally transmitted signals, and communicating meter values using remote communication methods. While communication of signals to local or remote computing devices is in widespread use, the most common means for communicating energy use is through the meter display.

In electronic meters, the meter display is often a relatively simple LCD segmented display panel that displays basic information, such as an accumulated energy usage value. In some meters, a technician can manipulate the display to obtain additional information about the meter.

One drawback to electronic meters with LCD (or other electronic) displays is that the display generally does not work during a power outages. To this end, in most electronic meters, the power for the meter circuits is obtained from the utility power lines that are being measured. When power is absent, the meter loses power. However, the utility meter has no energy consumption to measure when line power is absent, and the power loss to the meter is tolerable.

Nevertheless, it is sometimes desirable to access to information within a meter even when power is absent. For example, it is not inconceivable the periodic meter reading to take place during a power outage. In such a case, the lack of displayed information can be a disadvantage. Moreover, in many cases the power may be purposefully disconnected from a load for various reasons. In such cases, again, it may be a disadvantage to lack displayed information about a meter.

In most cases, the only way to obtain information from a meter during a power outage is to restart the meter, which requires utility power. This is not always possible, and in the case of purposefully removed power, disadvantageous.

Accordingly, there is a need for a method of obtaining data from a meter when utility power is absent from the meter.

SUMMARY OF THE INVENTION

The present invention addresses the above-described need, as well as others by providing a meter having a processing circuit that monitors for a signal at a first input generated by a magnetic switch, and activates to display one or more metering values on the display on a temporary basis responsive at least in part to the signal.

A first embodiment is a circuit arrangement for use in a utility meter. The circuit includes a processing circuit, a magnetically-actuated switch, and a first circuit. The processing circuit has a first mode and a second mode, and includes first and second inputs. The processing circuit performs a first set of metering operations related to energy metering in the first mode, and a second set of operations in the second mode or sleep mode. The second set of operations has fewer operations than the first set of operation. The processing circuit consumes less energy in the second mode than in the first mode. The magnetically-actuated switch has a first state and a second state and is coupled to provide a first output signal to the second input of the processing circuit. The first circuit is configured to generate a pulse signal responsive to the magnetically-actuated switch transitioning from the first state to the second state. The first circuit is further operably coupled to provide the pulse to the first input of the processing circuit. The processing circuit is configured to cause display of stored values responsive to receiving the pulse at the first input in the second mode and receiving the first output signal at the second input.

The above-described features and advantages, as well as others, will become more readily apparent to those of ordinary skill in the art by reference to the following detailed description and accompanying drawings.

DETAILED DESCRIPTION

Figure 1:
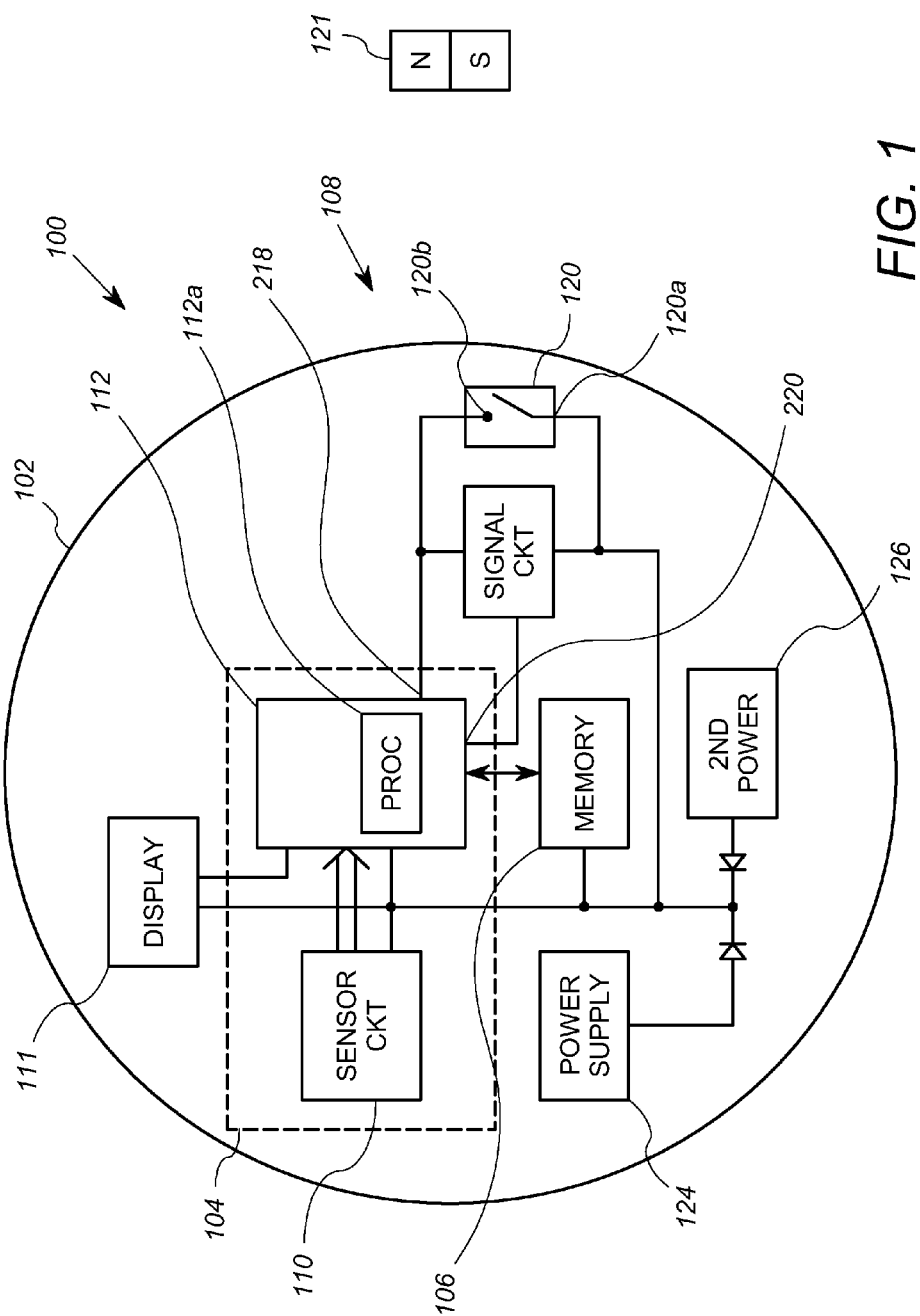
FIG. 1 shows a schematic block diagram of an exemplary electricity meter that incorporates an arrangement according to a first embodiment of the invention.

FIG. 1 shows an exemplary electricity meter 100 that incorporates an arrangement for obtaining display of metering values when external power in not available to the meter 100. The meter 100 includes a meter housing 102, which supports a metrology circuit 104, a memory 106, a magnetic switch arrangement 108, a processing circuit 112, a power supply 124 and a secondary power source 126. The processing circuit 112 may suitably also form part of the metrology circuit 104.

Figure 2:
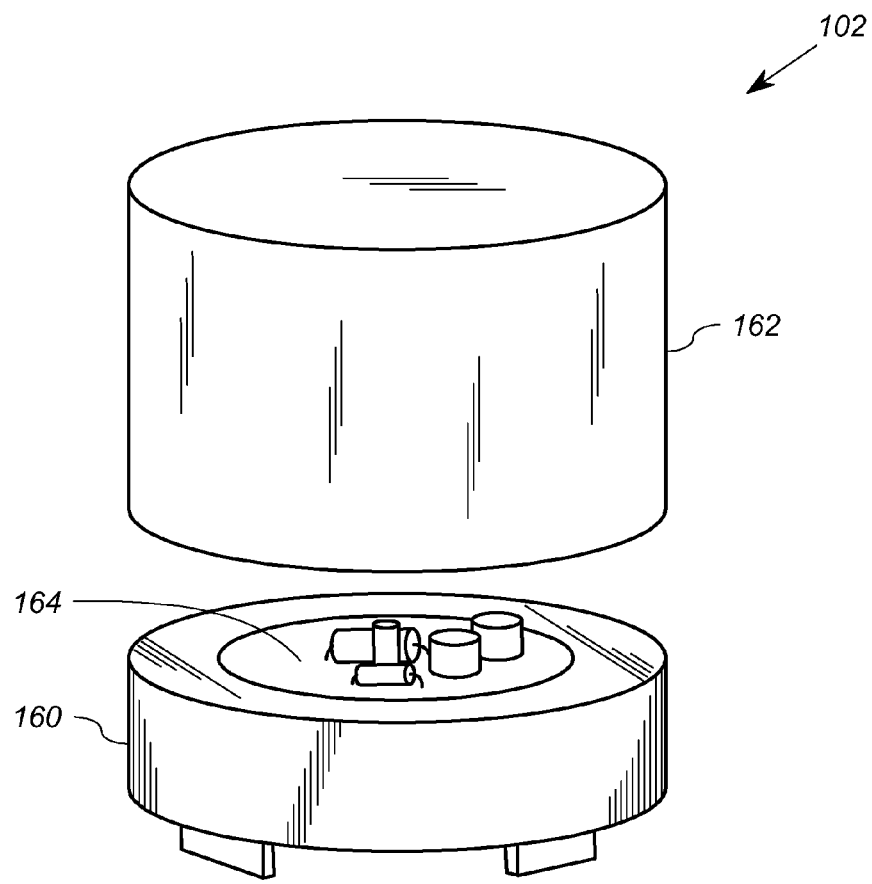
FIG. 2 shows a perspective view of the meter of FIG. 1.

The meter housing 102 further supports a display 111, which is operably connected to the processing circuit 112 in a conventional manner to display energy consumption information. FIG. 2 shows a perspective view of the meter 100 showing the general structure of the meter housing 102. As shown in FIG. 2, the meter housing 102 includes a meter base 160 and a meter cover 162. The meter base 160 includes a circuit board 164 affixed thereto. The circuit board 164 supports and provides interconnection to many of the circuit elements shown in FIG. 1, such as the processing circuit 112, at least part of the sensor circuit 110, the power supply 124, the secondary power source 126, the memory 106 and the detector circuit 108. The meter base 160 also supports the display 111. The meter cover 162 fits over the meter base 160, and provides security and environmental protection for the internal components of the meter 100. When the meter cover 162 is installed, outside users cannot access the internal components supported within the meter base 160.

Referring again to FIG. 1, the metrology circuit 104 is any suitable circuit that is configured to detect electricity delivered to the metered load, not shown in FIG. 1, and generate energy consumption-related information therefrom. Such circuits are well-known in the art. In this embodiment, the metrology circuit 104 includes a sensor circuit 110 and at least some of the functions of the processing circuit 112. The sensor circuit 110 in this embodiment includes voltage sensors and current sensors, not shown in FIG. 1 but are well known in the art, which sense electricity delivered to the load, and generate analog electricity measurement signals therefrom. The processing circuit 112 includes circuitry that converts the analog electricity measurement signals to digital measurement signals, and digital processing circuitry that calculates various energy-consumption related values based on the digital measurement signals. The processing circuit 112 may suitably include one or more processing devices capable of carry out these functions, as is known in the art.

The memory 106 in this drawing is representative of a non-volatile memory, such as flash memory or the like. However, it will be appreciated that the memory 106 may be a set of memories that includes one or more of flash memory, non-volatile RAM, and even volatile memory. Moreover, the processing circuit 112 also includes working memory, such as RAM and data registers, as is known in the art.

The power supply 124 is a circuit that provides bias power to the processing circuit 112 and other circuit elements during normal operation of the meter 100. To this end, the power supply 124 obtains electrical energy from the utility power lines and generates the necessarily DC bias voltages for the processing circuit 112 and other circuits. Such power supplies are known in the art.

The secondary power source 126 is a circuit that provides temporary power to one or more circuits such as the processing circuit 112 on a temporary basis when utility power is not available to the power supply 124. The secondary power source 126 typically includes at least one energy storage device such as a battery and/or capacitors. U.S. patent application Ser. No. 13/464,374, which is owned by the same owner as the present application, and which is incorporated herein by reference, shows an exemplary circuit for providing temporary back-up power for metering devices.

The magnetic switch arrangement 108 is an arrangement of elements that is configured to detect the presence of a magnetic field in a predetermined location, and provide at least two signals responsive to the detection of the magnetic field. In the exemplary embodiment described herein, the magnetic switch arrangement 108 includes a magnetically actuated switch 120 and a signal circuit 122. Although not visible in FIG. 2, the magnetically actuated switch 120 and the signal circuit 122 are both disposed on the circuit board 164.

The magnetically actuated switch 120 is a device including contacts that make or break electrical connection based on mechanical activity corresponding to the presence of a magnetic field adjacent the switch 120. In general, the magnetically actuated switch 120 is configured and positioned such that a magnetic device or magnetic element 121, located external to the meter 100, may used to actuate the switch 120. Such switching configurations are known. In such configurations, placement of the magnetic element 121 against the meter housing 102, preferably against the meter cover 162, causes a transition of the switch 120, for example, to the closed (actuated) state. When the magnetic element 121 is removed from the vicinity of the magnetically actuated switch 120, then the switch 120 transitions back to the normally (unactuated) open state. To this end, the switch 120 may suitably be a reed switch disposed on the circuit board 164 adjacent to the cover 162. Suitable configurations of reed switches in electricity meters are well known in the art may take many forms.

In general, the magnetically actuated switch 120 is configured to make (closed) and break (open) an electrical connection between two contacts 120a, 120b thereof. The first contact 120a is operably connected to both the power supply 124 and the secondary power source 126. The second contact 120b is operably connected to the processing circuit 112 and to the signal circuit 122. The signal circuit 122 is a circuit that is configured to generate a pulse signal responsive to a positive transition signal received from the contact 120b. For example, when the switch 120 is closed, then the voltage at the contact 120b transitions from 0 to a positive logic voltage. The signal circuit 122 is configured to generate a pulse responsive to the transition.

Referring now to the processing circuit 112, in addition to the operations as part of the metrology circuit 104, the processing circuit 112 performs operations involving supervisory functions, display functions, and other functions within the meter 100. To perform all of such functions of the processing circuit 112, the processing circuit 112 includes at least a first processor 112a and in some cases multiple processors. The processor 112a in this embodiment is a 71M6533 metering integrated circuit available from Teridian. However, it will be appreciated that other processing devices may be used.

In general, the processor 112a, and hence the overall processing circuit 112, has a first mode and a second mode. In the first mode, the processor 112a performs a first set of metering operations related to energy metering, as discussed above. In the second mode, the processor 112a performs a second set of operations in the second mode, the second set of operations having fewer operations than the first set of operations. The second mode is often referred to as a sleep mode, and is a reduced power state with minimal functionality. In the second mode, the processor 112a may be in the reduced power (sleep mode) state and any other circuitry of the processing circuit 112 may not be powered at all. Accordingly, the processing circuit 112 consumes less energy in the second mode than in the first mode.

To this end, in the first mode or "active mode", the processor 112a and other components of the processing circuit 112 receive operating bias power from the power supply 124. The processing circuit 112 operates in the active mode when utility power is available to the meter. In the second mode or "sleep mode", the processor 112a is operably connected to receive power from the secondary power source 126, and other portions of the processing circuit 112 receive no operating power. The processing circuit 112 is in the sleep mode primarily when utility power is not available to the meter 100. In the sleep mode, the first processor 112a ceases substantially all of its operations in the supervisory, display and metrology functions of the meter 100. The first processor 112a is configured to resume active mode, and such functions, upon restoration of utility power.

However, in accordance with the present invention, the processor 112a is further configured to operate in a third mode upon receiving a wake-up signal at a first input 220 while in the sleep mode. In this third mode, the processor 112a causes display of stored metering values responsive to receiving, at a second input 218, a high logic signal from the contact 120b of the switch 120. To this end, the processor 120a is configured to execute software instructions stored in the memory 106 or in internal memory to perform the functions of FIG. 3, discussed below.

Figure 3:
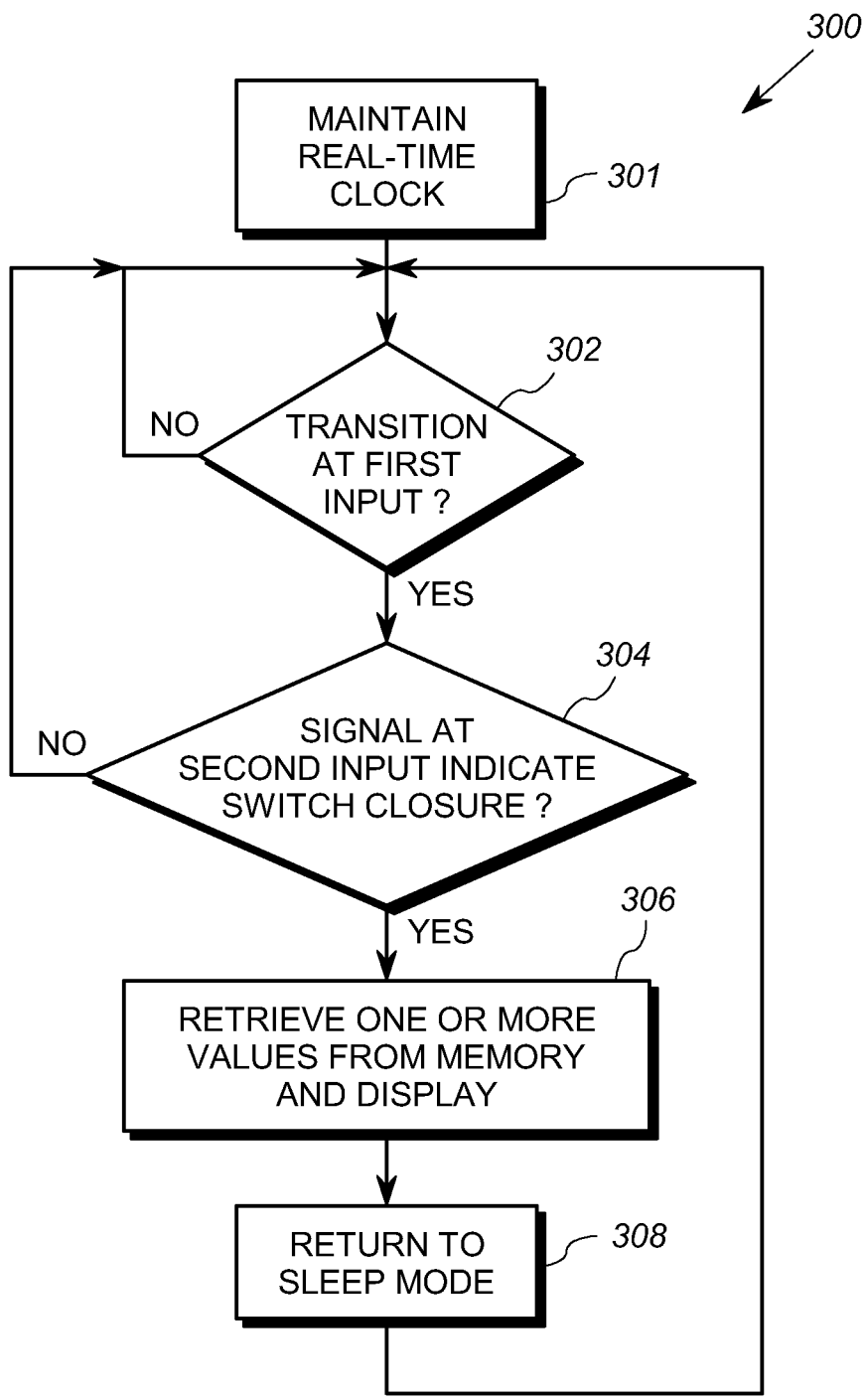
FIG. 3 shows a flow diagram of a first exemplary set of operations of a processor of the meter of FIG. 1 when power is absent from the primary power supply of the meter.

In particular, FIG. 3 shows a flow diagram 300 of the operations of the processor 112a in the sleep mode and third mode. The operations of the processor 112a in the normal active mode are not illustrated herein, and may take any suitable form. Referring now to FIG. 3, steps 301 and 302 represent the operations of the processor 112a in the sleep mode. When in the sleep mode, the processor 112a performs minimal functions, such as maintaining an internal clock (step 301). Moreover, the processor 112a also monitors to determine whether it has received a positive transition signal (or other signal) at the first input 220 from the signal circuit 122 (step 302). If not, the processor 112a continues to monitor by returning to step 302.

If so, however, then the processor 112a proceeds to step 304, which is the beginning of the third mode. To this end, the processor 112a must "power-up" to a more active state to perform the operations of steps 304 and 306. It will be appreciated that the processor 112a continues to maintain the real-time clock even when powered up in the third mode (as well as in the active/first mode). Once powered up, in step 304, the processor 112a the signal provided by the switch 120 indicates that the switch 120 has been magnetically actuated. In this embodiment, the processor 112a in step 304 determines that the switch is closed by determining whether the switch contact 120b has a high logic level voltage. The signal at the second input 218 of the processor 112a indicates the voltage at the switch contact 120b. If the signal at the second input 218 is at the high logic voltage, then the processor 112a proceeds to step 306. If not, then the processor 112a may perform another function and/or return directly to step 302.

Accordingly, the processor 112a performs step 306 when the signal at the second input 218 is has been magnetically actuated. In step 306, the processor 112a retrieves one or more metering values, such as primary energy consumption values, and causes them to be displayed on the display 111.

After step 306, the processor 112a returns to the sleep mode in step 308, thereby returning to step 302.

It will be appreciated that in some embodiments, the processor 112a may scan for input signals at one or more other inputs after transitioning to the third mode in step 302. For example, as discussed below in connection with FIGS. 6 to 8, the meter 100 may suitably include a sensor switch that changes state responsive to some tamper event and/or mechanical activity related to the meter housing. Such a switch may also be used to generate a "wake-up" transition signal at the first input 220.

Referring again generally to FIGS. 1 and 2, during normal operation, the power supply 124 uses the utility power and generates biasing power for the processing circuit 112, the display 111 and other circuitry within the meter 100. Accordingly, the processing circuit 112 and the processor are in the active mode. The metrology circuit 104 operates to detect and measure electrical energy consumption (or related values) delivered from the utility power lines to the load. The processing circuit 112, assists in such energy consumption measurement and further causes energy consumption information to be displayed on the display 111. As is known in the art, display of energy consumption information allows for a meter reader to obtain information used by the utility service provider for billing, as well as other purposes. In alternative embodiments, the processing circuit 112 may cause the energy consumption information to be transmitted to a remote meter reading device, not shown, via a transmission device, also not shown. The above operations are conventional in the metering industry, and may take many forms. The processor 112a may perform many or all of these functions of the processing circuit 112.

In addition, during normal operation (and the absence of application of the magnetic element 121), the magnetically actuated switch 120 is open. Because the switch 120 is in the open state and has not transitioned to the closed state, the signal circuit 122 produces no output, or at least no pulse signal. Similarly, the processor 112a does not receive any signal (or receives a low logic signal) at the second input 218 from the switch contact 120b.

However, if the magnetic element 121 is placed against or near the outside of the cover 162 at a location proximate to the location of the switch 120 inside the cover 162, the switch 120 closes, thereby coupling the bias voltage from the power supply 124 from the contact 120a to the contact 120b. The signal circuit 122 receives the signal and produces a pulse output signal, which is provided to the first input 220 of the processor 112a. The second input 218 of the processor 112a likewise receives the bias voltage, which forms a high logic voltage, from the contact 120b.

It will be appreciated, however, that because the processor 112a is in the active mode, it ignores the pulse signal received from the signal circuit 122. To this end, the processor 112a only monitors the first input 220 when in sleep mode, for example, during a power outage. Nevertheless, the processor 112a, responsive to the voltage received at the second input 218, may suitably execute one or more routines as defined by the software in the processor 112a. In particular, it is known in the metering art to employ a reed switch (i.e. the switch 120) to allow a technician to perform rudimentary interaction with the meter 100. Such tasks can include causing temporary display of internal data values not normally displayed. The technician can perform a task by placing the magnetic element 121 proximate to the switch 120.

In the event of a power outage or power interruption, the power supply 124 can no longer generate bias power for the processing circuit 112, the display 111 and other circuits.

Accordingly, the secondary power source 126 provides bias power to at least some of the circuits within the meter 100. However, one or more circuits of the meter 100 are disabled to conserve the power in the secondary power source 126. In this embodiment, for example, the first processor 112a goes into sleep mode. As discussed above, in the sleep mode, the processor 112a does not perform operations that calculate energy values or perform other metering operations. Instead, the processor 112a performs minimal operations so that its power consumption is very small, such as one or two orders of magnitude less than that during active mode. The minimal operations include monitoring the first input 220, and in this embodiment, maintaining an internal time/date clock. (See, e.g. step 301 of FIG. 3).

Thus, during a power outage, as long as no magnetic element is used to actuate the switch 120, then switch 120 remains in the open state. As a consequence, the signal circuit 122 does not generate the pulse signal, and the processor 112a does not receive any signal from the contact 120b at the first input 220. (Step 302 of FIG. 3). However, if a magnet such as the magnetic element 121 is used to actuate the switch 120, then the switch 120 closes. As a consequence, the signal circuit 122 provides the pulse signal to the first input 220 of the processor 112a.

In response to the pulse signal, the processor 112a performs another task to determine whether an input is present at the second input 218 that indicates closure of the switch 120. (Step 304 of FIG. 3). In some embodiments, the processor 112a may also determine the state of one or more other inputs of switches, such as in the embodiment discussed below in connection with FIGS. 6 to 8.

Because the switch 120 is closed, the processor 112a receives at its second input 218 the high logic voltage, and hence determines (in step 304) that the switch 120 is closed. As a consequence, the processor 112a retrieves meter data from the memory 106 and causes display of one or more values on the display 111. (Step 306 of FIG. 3). After causing the display for a temporary period, the processor 112a turns off the display 111 and returns to the sleep mode, monitoring for pulse signals from the signal circuit 122. (Steps 301, 302 of FIG. 3).

One advantage of using a pulse signal to cause the processor 112a to activate to perform the display operation is that it prevents the possibility of a single placement of a magnet over the switch 120 to cause repeated display operations and premature exhaustion of the secondary power source 126. For example, if the magnet is left over the switch 120 for a long period of time, then the processor 112a would continuously re-awaken in step 302 to re-display the values. By using a pulse signal that is activated only upon transition of the switch 120, leaving the magnet on the switch 120 will not result in continuous repeated performance of step 306.

Figure 4:
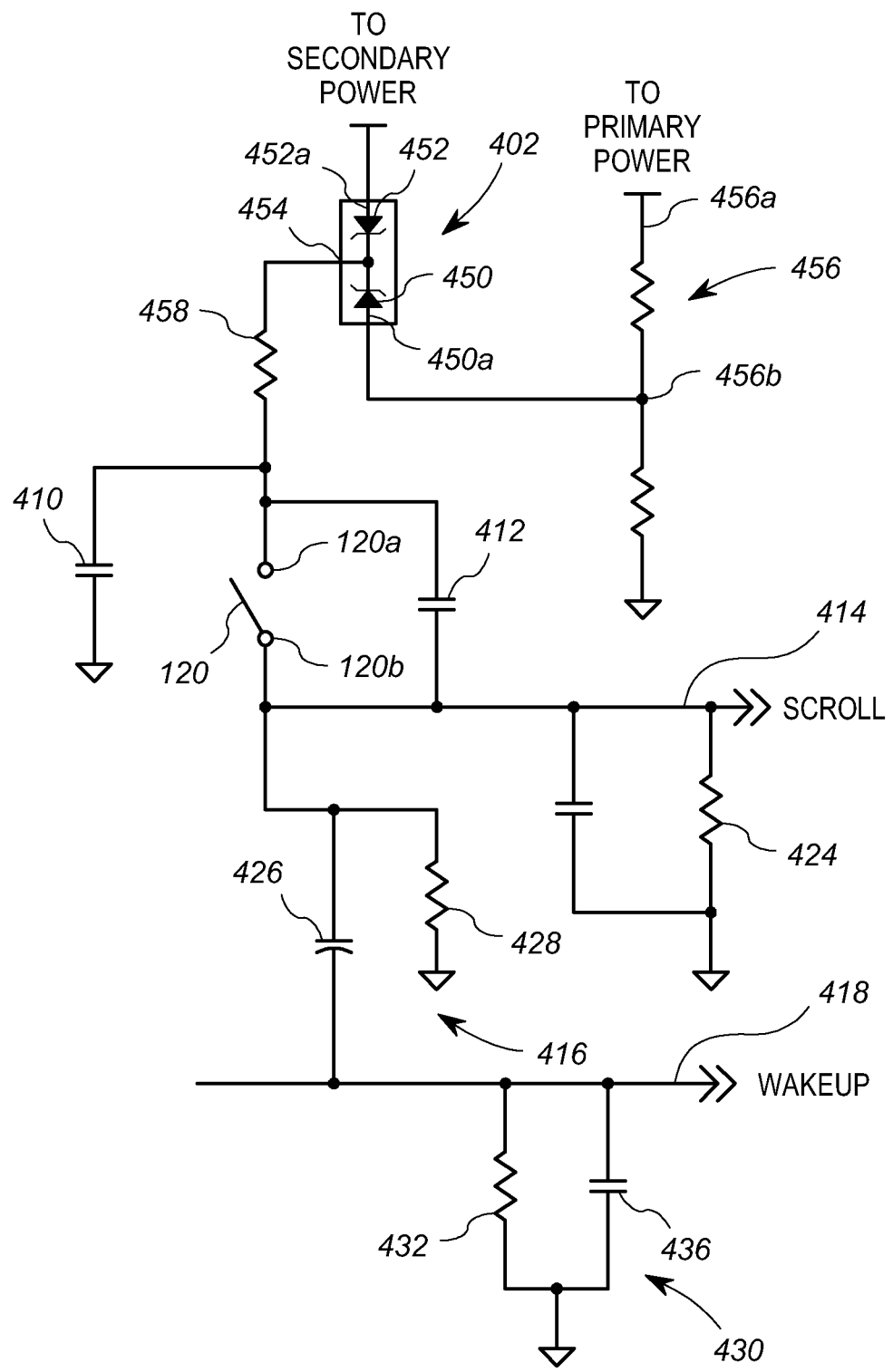
FIG. 4 shows a schematic block diagram an exemplary magnetic switch arrangement of the meter of FIG. 1.

A more detailed view of an exemplary embodiment of the magnetic switch arrangement 108 is shown in FIG. 4. As shown in FIG. 4, the signal circuit 122 in this embodiment includes an OR circuit 402, a first output 414, a second output 418, a pulse circuit 416, a smoothing filter 430, and various RF suppression and filtering elements, including capacitors 410, 412 and 422, and the resistor 424.

In particular, the first contact 120a of the magnetic switch 120 is operably connected to the primary power supply 124 and secondary power supply 126 through the OR circuit 402. The OR circuit 402 is configured to provide bias power to the first contact 120a from the primary power supply 124 when the power supply 124 is operating, and to provide bias power to the first contact 120a from the secondary power source 126 when the primary power supply 124 is not operating. To this end, the OR circuit 402 includes two Schottky diodes 450, 452 connected to each other at their respective cathodes at an output node 454. In this embodiment, the OR circuit 402 further includes a voltage divider circuit 456 having an input 456a operably coupled to a five volt output of the primary power supply 124, not shown in FIG. 4, and an output 456b coupled to an anode 450a of the diode 450. The voltage divider circuit 456, which may suitably include a 1 k resistor coupled between the input 456a and the output 456b, and a 3.74 k resistor coupled between the output 456b and ground, is configured to provide a voltage at the output 456b that is just greater than that of the secondary power source 126.

The anode 452a of the diode 452 is coupled to a 3.6 volt secondary output of the secondary power source 126, not shown in FIG. 4. The output node 454 is coupled through a resistor 458 to the contact 120a of the switch 120. The resistor 458 may suitably be a 100 ohm resistor.

In this embodiment, the capacitor 410 is also coupled between the contact 120a and ground. The capacitor 410 has a value selected to aid in the suppression of relevant RF noise, and may suitably have a value of 330 pF. The capacitor 412 is coupled across the contacts 120a, 120b of the switch 120 for the purpose of suppressing RF noise.

The contact 120b is further connected to the first output 414 of the signal circuit 122, which essentially provides a signal representative of the current state of the switch 120. The first output 414 is coupled to the second input 218 of the processor 112a, not shown in FIG. 4. In this embodiment, a 330 pF capacitor 422 and a 100 k resistor 424 are coupled between the first output 414 and ground for the purpose of providing a discharge path for the charge stored in the capacitors 426 and also RF suppression.

The pulse circuit 416 is coupled between the second contact 120b of the switch 120, and the second output 418. The second output 418 is connected to the first input 220 of the processor 112a, not shown in FIG. 4. The pulse circuit 416 is configured to provide to the second output 418 a temporary pulse upon the transition of the switch 120 from the open to closed state. In this embodiment, the pulse circuit 416 includes one or more capacitors 426 having an effective capacitance of approximately 2 µF and a 100 k resistor 428. The smoothing filter 430 includes a resistor 432 and a capacitor 434, both coupled between the second output 418 and ground. The smoothing circuit 430 is configured as a differentiator that assists in generating pulses.

In operation, the contact 120a receives a bias voltage from the OR circuit 402. In particular, if the primary power supply 124 is operating, then 5 volts appears at the input 456a of the voltage divider 456. As a result, the voltage at the output 456b will exceed the voltage at from the secondary power source 126, and the voltage at the output node 454 will be (approximately) the voltage divider output voltage. Alternatively, if the primary power supply 124 is not operating, then the 3.6 volts at the anode 452a from the secondary power source 126 is provided at the output node 454. Accordingly, regardless of whether the primary power supply 124 is operating, a bias voltage is present at the contact 120a of the switch 120.

If the switch 120 is open, such as during normal operation with no magnet disposed proximate to the magnetic switch 120, then the open circuit created by the open magnetic switch 120 causes no voltage to be present at the output 414. Similarly, during steady state, the open state of the magnetic switch 120 causes no voltage to be provided at the second output 418. As discussed above in connection with FIG. 1, the processor 112a does not alter its current state (either in sleep mode or active mode) when no signal is received from either of the outputs 414, 418.

From time to time, the switch 120 may be closed by operation of technician placing a magnetic device on or near the switch 120. In such a case, the positive voltage at the contact 120a propagates to the second contact 120b, and from there to the output 414. Accordingly, the processor 112a receives a high logic voltage from the switch contact 120b at the second input 218. The signal at the first output 414 remains at the high logic voltage until the switch 120 is opened.

Figure 5:
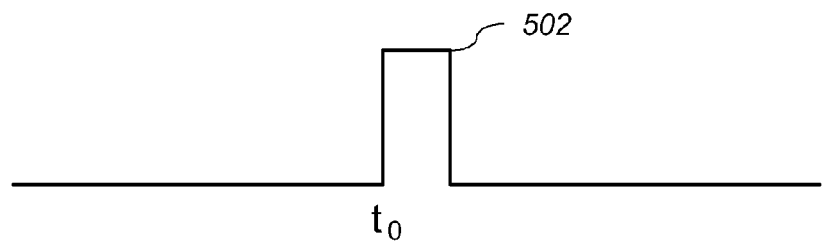
FIG. 5 shows a timing diagram of an exemplary pulse signal output by the magnetic switch signal circuit of the meter of FIG. 1.

In addition, the pulse circuit 416 generates a high logic pulse. To this end, at the moment of switch closure, the voltage at the contact 120b moves instantly toward the high logic voltage that is already present at the contact 120a. Because the voltage across the capacitor 426 cannot change instantaneously, the capacitor 426 passes, temporarily, the high logic voltage at the second contact 120b to the second output 418. After a brief time, the capacitor 426 discharges through the resistor 424 and acts as an open circuit between the second contact 120b and the second output 418. The smoothing circuit 430 works to elongate the pulse slightly by storing and slowly discharging the instantaneous pulse from the capacitor 426. The result is the pulse shown in FIG. 5. In particular, FIG. 5 shows a pulse 502 that occurs upon transition of the switch 120 from the open state to the closed state at time $t_0$.

As discussed above, if the processor 112a is in the sleep mode, then it detects the pulse 502 at its first input 220. The processor 112a then powers up sufficiently to check, among other things, the value at the second input 218, as per step 306 of FIG. 3. The processor 112a in the temporarily powered up state then performs a predetermined display routine if the value at the second input 218 is a high logic level.

If, however, then processor 112a is already in the active state, such as during normal operation, then, in this embodiment, the processor 112a ignores the pulse from the second output 418. Instead, the processor 112a monitors the first output 414 on an ongoing basis during the active state. As a consequence, no "wake-up" pulse on the second output 418 is necessary.

As discussed above, it will be appreciated that the use of the pulse 502 (see FIG. 5) as the "wake-up" signal for the processing circuit 112 (and specifically the processor 112a) allows for additional pulses or other signals to be received and recognized on the first input 220, potentially from other sources signaling other events, even while the switch 120 remains closed.

For example, in one embodiment of the meter 100', the meter 100' further includes a cover switch arrangement that is used to detect removal of a cover of the meter housing 102. Such an arrangement may suitably include a mechanical switch that configured to make or break a signal path to the processing circuit 112 dependent on some mechanical state of the meter housing 102. For example, such a switch may be open when the meter housing 102 is in normal working order, and may be closed whenever the meter cover is removed from the housing 102. Such a mechanism may be used for tamper detection.

Figure 6:
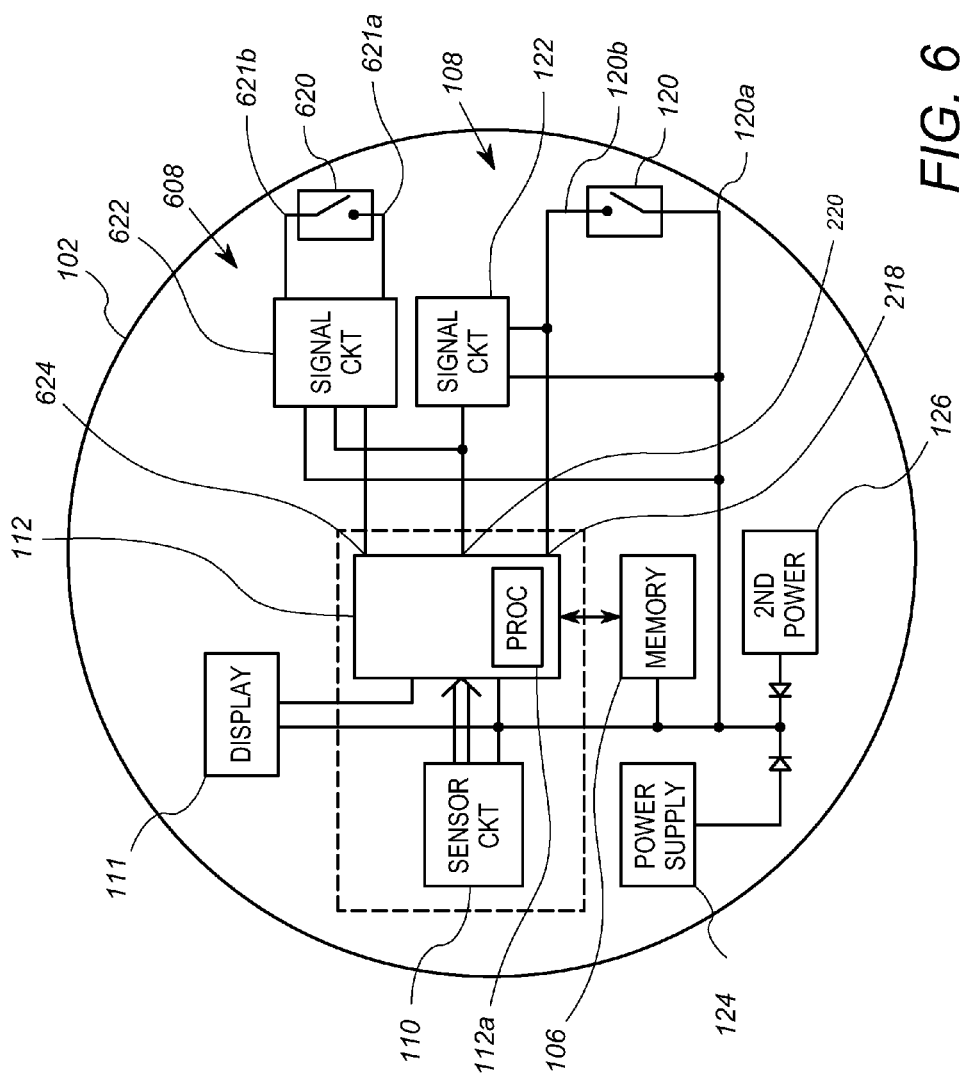
FIG. 6 shows a schematic block diagram of a second exemplary electricity meter that incorporates an arrangement according to another embodiment of the invention.

FIG. 6, for example, shows an alternative embodiment of the meter 100' that further includes both the magnetic switch arrangement 108 as discussed above and a meter cover switch arrangement 608. The meter 100' essentially includes all of the functionality of the meter 100 of FIGS. 1 and 2, but with an additional arrangement for detecting certain forms of tampering or other mechanical activity that can detect such mechanical activity during a power outage, among other times. The meter 100' thus includes all of the elements shown in FIG. 1, including the meter housing 102, the metrology circuit 104, the memory 106, the magnetic switch arrangement 108, the display 111, the processing circuit 112, the power supply 124 and the secondary power source 126, all connected and configured in the manner described above in connection with FIG. 1. The meter 100' also includes all of the elements shown in FIG. 2, including the meter cover 162, meter base 160 and circuit board 164. Referring again to FIG. 1, the metrology circuit 104, the memory 106, the power supply 124, the secondary power source 126 and the magnetic switch arrangement 108 all operated in the manner described above in connection with FIG. 1.

In addition, as shown in FIG. 6, the meter 100' includes the meter cover switch arrangement 608. Moreover, the processing circuit 112 is further configured to process signals from the meter switch arrangement 608 in order to store, display and/or communicate potential tampering events. In this embodiment, the meter cover switch arrangement 608 is configured to generate signals signaling the removal of the meter cover 162, or at least of the state of the meter cover 162.

More specifically, the meter cover switch arrangement 608 is an arrangement of elements that is configured to detect mechanical activity, such as meter cover removal, impact forces, or meter removal, and provide suitable signals to the processing circuit 112 for recordation, display or communication of the detected meter cover event. In the exemplary embodiment described herein, the meter cover switch arrangement 608 is configured to detect and signal the removal of the meter cover 162 from the meter base 160. To this end, the meter cover switch arrangement 608 includes at least one mechanical switch 620, conductors 621a, 621b and a signal circuit 622. Although not shown in FIG. 2, the mechanical switch 620, the conductors 621a, 621b and the signal circuit 622 are all disposed on the circuit board 164. The conductors 621a, 621b may suitably be traces defined on the surface of the circuit board 164.

The mechanical switch 620 is a device including contacts that make or break electrical connection based on mechanical activity corresponding to a potential tamper event. To this end, the mechanical switch 620 is configured to make (closed) and break (open) an electrical connection between the conductors 621a, 621b. In this embodiment, the mechanical switch 620 may include a set of electrical contacts that only make contact between the conductors 621a, 621b when the meter cover 162 is removed from (i.e. disconnected from or separated from) the meter base 160. By contrast, when the meter cover 162 is properly installed on the meter base 160, then the mechanical switch 120 breaks the connection between the conductors 621a, 621b. It will be appreciated that there are many conceivable arrangements of a switch 120 that closes when the meter cover 162 is removed and opens when the meter cover 160 is installed. The details of implementation of such an arrangement could take many forms, and would be known to those of ordinary skill in the art. The inventive features discussed herein are applicable to any such configuration.

In yet other embodiments, another mechanical switch 620 may be one that makes contact responsive to impact forces or tilting of the meter. Such arrangements are also known.

In any event, the signal circuit 622 is a circuit that is operably connected to determine whether the conductors 621a, 621b are connected (via closed switch 620) or disconnected (via open switch 620). The signal circuit 622 is further configured to generate, responsive to the detection of a connection between the conductors 621a, 621b, two output signals. The two output signals include a first output signal and a latched output signal. The signal circuit 122 is operably connected to provide the first output signal to the first input 220 of the processor 112a, and to provide the latched output signal to a third input 624 of the processing circuit 112, as will be discussed below in detail.

It will be appreciated that the signal circuit 622 may alternatively be configured to generate the first output signal and the latched output signal responsive to a temporary opening of the mechanical switch 620. In such a case, the mechanical switch 620 would be normally closed, and only opened upon detection of a mechanical event. Such an alternative, however, may require more energy from the secondary power source 126 and therefore would be less preferable.

Referring again to the processor 112a, the processor 112a in this embodiment is generally configured (via software programming) to carry out the steps of FIG. 3. However, in the embodiment, the processor 112a furthermore determines the state of the third input 624 when in the third mode. If the processor 112a determines that the signal at the third input 624 indicates that the mechanical switch 620 is closed (or otherwise indicates an abnormal meter state), then the processor 112a stores, displays and/or communicates an indication that the meter cover 162 has been removed. This stored, displayed or communicated information may then be used by the utility to detect unauthorized tampering with the meter 100'.

To this end, when the meter cover 162 is removed, the mechanical switch 620 closes. The signal circuit 622, responsive to the completed circuit across contacts 621a, 621b, generates a first signal and provides the signal to the first input 220 of the processor 112a. It will be appreciated, therefore, that the same first input 220 of the processor 112a is configured to receive a signal from both the magnetic switch arrangement 108 and the cover switch arrangement 608.

As discussed above, if the processor 112a is in a sleep mode, then it responds to signal received at the first input 220 by activating out of the sleep mode (See step 302 of FIG. 3). In such a case, the processor 112a performs another task to determine whether an input is present at the third input 624 due to closure of the mechanical switch 620. If it is not, then the processor 112a determines if a signal is present at the second input 218 due to closure of the magnetic switch 120. If, however, the switch 620 is closed, then the processor 112a detects the signal at the third input 624 and stores an indication that the meter cover 162 has been removed in the memory 106. The indication may suitably be an event record that includes the date and time of the detection of the opening of the switch 620.

Otherwise, if the processor 112a is not in sleep mode when the cover 162 is removed, but is rather in active mode performing normal metering operations, or in the third mode performing meter display operations (e.g. step 306 of FIG. 3), then the processor 112a detects the signal present at the third input 624 due to the closing of the switch 620 and similarly records an indication of the cover opening event.

In other operation, if the cover 162 is not removed, the meter 100' operates as substantially described above in connection with FIG. 1. Accordingly, details of the operation of the meter 100' regarding normal metering operations, as well as operations that occur if the magnetic switch 120 is closed, are discussed above in connection with FIG. 1. In addition, however, while the processor 112a is generating a display as discussed above in connection with step 306, the processor 112a furthermore monitors the first input 220 for another positive signal. If another positive signal is received at the first input 220, the processor 112a again determines whether the cover switch 620 has been closed. Thus, if the cover switch 620 is closed (due to removal of the meter cover 162) while the processor is currently executing step 306 of FIG. 3 to display metering information during a power outage, the processor 112a nevertheless detects the cover removal.

This embodiment illustrates the way that a display operation may be activated temporarily on a meter that lacks primary power, which is combined with an operation that detects meter cover removal when the meter lacks primary power. In this embodiment, the magnetic switch 120 only generates pulse signal so that processor 112a can operate to process a limited display routine, while nevertheless continuing to monitor for a cover removal.

Further detail regarding a specific embodiment of an arrangement for detecting mechanical switch and magnetic switch activity during a power outage is provided below in connection with FIG. 7. To this end, FIG. 7 shows a schematic diagram of exemplary embodiments of the magnetic switch arrangement 108, the cover switch arrangement 608 and the processor 112a of FIG. 6.

Figure 7:
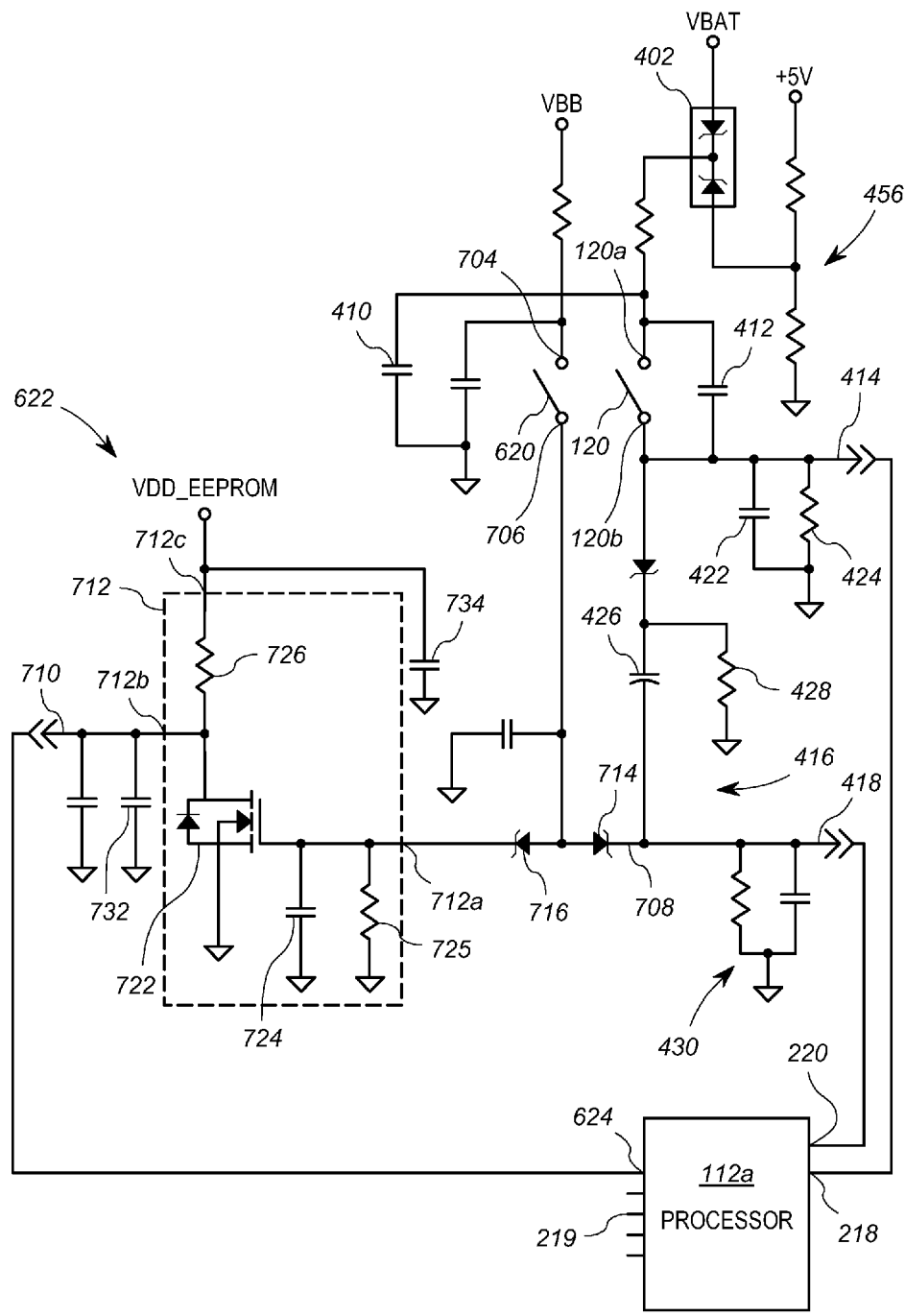
FIG. 7 shows a schematic block diagram an exemplary magnetic switch arrangement and a cover switch arrangement of the meter of FIG. 1.

The magnetic switch arrangement 108 of FIG. 7 is preferably the same circuit as that shown in FIG. 4, and has substantially the same structure. Accordingly, the elements of the magnetic switch arrangement 108 bear the same reference numbers as the corresponding elements of FIG. 4. As discussed above, the first output 414 of the magnetic switch arrangement 108 is coupled to the second input 218 of the processor 112a, and the second output 416 is coupled to the first input 220 of the processor 112a.

As discussed above, the processor 112a may suitably be a metering integrated circuit, such as a Teridian 71M6533 integrated circuit. The processor 112a includes a plurality of terminals 219 for data input and data output that may suitably be connected to various other elements in the meter 100, including the display 111, the memory 106, and the sensor circuit 110. At least one of the terminals 219 constitutes a power input for bias power from the primary power supply 124 and the secondary power source 129. In accordance with at least this embodiment, the processor 112a further includes the first input 218, the second input 220 and the third input 624, discussed further above. The processor 112a is configured to execute programming structures stored in the memory 106 to carry out the operations of FIG. 8, discussed further below.

Referring now to the cover switch arrangement 608, the mechanical switch 620 includes a first contact 704 electrically coupled to the first conductor 621a and a second contact 706 electrically coupled to the second conductor 621b. As discussed above in connection with FIG. 6, the mechanical switch 620 is configured to switch to a closed state (electrically connecting its contacts 704, 706) when the cover 162 is removed from the meter base 160. The mechanical switch 620 is further configured to switch from a closed state to an open state (breaking the connection between contacts 704, 706) when the meter cover 162 is properly installed on the meter base 160.

To this end, for example, the switch 620 in this embodiment is spring-loaded and normally biased in the closed position. However, the meter cover 162 may suitably include a mechanical or physical feature, not shown, that urges the switch 620 into the open position when the meter cover 162 is properly is installed. Accordingly, whenever the meter cover 162 is removed, the mechanical switch 620 biases back to the closed position.

The signal circuit 622 includes a latch circuit 712, a first rectifier 714, a second rectifier 716, a first output 708 and a latched output 710. The latch circuit 712 is a circuit that is configured to receive a close signal indicative of a closure of the switch 620, and latch the signal in a first logic state for a predetermined amount of time. The first logic state, which in the embodiment described herein is "low", is different from the logic state that is present when the switch 620 is open in steady state. The predetermined amount of time corresponds to the time it takes for the processor 112a to transition from the sleep state to an active state, together with the time it takes for the processor 112a to detect the state of the logic value at its input 624.

In this embodiment, the latch circuit includes a semiconductor switch 722, a capacitor 724, a discharge resistor 725, and a bias resistor 726, connected in a manner described further below. The signal circuit 622 further includes first and second RF suppression capacitors 732, 734, each having a capacitance value of 330 pF. One RF suppression capacitor 732 is coupled between the second output 710 and ground, and the other RF suppression capacitor 734 is coupled between the bias voltage connection to the bias resistor 726 and ground.

Referring again generally to the arrangement 700, the first conductor 621a is operably connected to a source of DC bias power that provides power to the arrangement 700 regardless of whether the primary power supply 624 is in operation. Accordingly, the first conductor 621a is operably connected to at least the secondary power source 626, and preferably also the primary power supply 624. The second conductor 621b constitutes the switched output, and is operably connected to the first output 708 via the first rectifier 714. In this embodiment, the first rectifier 714 is a zener diode forward biased from the conductor 621b to the first output 708. The first output 708 is operably connected to the first input 218 of the processor 112a.

The second conductor 721b is further operably connected to the input 712a, which is also the input to the semiconductor switch 722, via the second rectifier 716. The second rectifier 716 may also be a zener diode, and is forward biased from the second conductor 721b to the input 712a. Referring to the latch circuit 712, the capacitor 724 is connected between the input 712a and circuit ground. The discharge resistor 725 is also connected between the input 712a and circuit ground, parallel to the capacitor 724. The capacitor 724 and discharge resistor 725 are selected to have a time constant sufficient to hold the voltage at the input 712a above the turn-on threshold of the switch 722 for at least the predetermined time as defined above.

The bias resistor 726 is coupled between the DC bias power sources 124, 126 and the latch output 712b, which also forms the output terminal of the semiconductor switch 722. The semiconductor switch 722 also includes a terminal 712c coupled to circuit ground. In this embodiment, the semiconductor switch 722 is an FET device. The output 712b of the latch 712 is coupled to the latched output 710, which in turn is coupled to the second input 624 of the processor 112a.

In general, the switch 722 in this embodiment is configured to close only when an event occurs that is indicative of tampering. As discussed above, the switch 722 may be configured to be closed only when the meter cover 162 is not properly installed on the meter base 160. The switch 722 may also be a tilt sensor or other sensor that closes when the meter 100' experiences a strong impact or force.

In the operation of the embodiment described herein, when the meter cover 162 is properly installed on the meter base 160, the switch 720 is in the open state. As a consequence, no voltage is present at the first output 708, or at the latch input 712a. Assuming steady state operation, the capacitor 724 is discharged. Accordingly, the switch 722 does not conduct, and the high logic voltage from the bias voltage source, which may be either the power supply 124 or the secondary power source 126, causes the latched output 710 to be in the high state. The high logic signal propagates from the output 710 to the input 624 of the processor 112a. If the processor 112a is currently in the sleep mode (i.e. during a power interruption), then the high logic signal at the input 624 is not processed. If, however, the processor 112a is in the normal active mode, then the processor 112a detects the high logic signal. Nevertheless, the processor 112a does not record or display any cover removal (or other mechanical) event because the of the high logic signal at the third input 624.

If, however, the meter cover 162 is removed, then the switch 620 changes to the closed state due to mechanical configuration as discussed above. As a consequence, the bias voltage from the bias voltage source 124 or 126 appears on the conductor 621b. This voltage, which is a high logic voltage, propagates both to the first output 708 and to the latch input 712a. The high logic signal propagates from the first output 708 to the first input 220 of the processor 112a. If the processor 112a is in the active mode, then the signal at the first input 220 has no effect. If, however, the processor 112a is in the sleep mode, or in the third mode (i.e processing a magnetic switch closure), then the signal at the first input 220 causes the processor 112a to transition to the active mode at least temporarily as will be discussed below in connection with FIG. 8.

In any event, the closed switch 620 causes a high logic voltage to also appear at the latch input 712a. The high logic voltage charges the capacitor 724 and turns on the semiconductor switch 722. The conducting semiconductor switch 722 pulls the output 712b low, thereby changing the latched output signal to a low logic signal. The latched output signal at the low logic signal propagates to the second input 624 of the processor 112a. If the processor 112a is in the active mode, or has awoken to the third mode, then the processor 112a detects the low logic voltage at the input 624 and processes an event responsive thereto. To process the event, the processor 112a stores a flag or other record of the event in memory, such as the memory 106. Alternatively, or in addition, the processor 112a may cause a display of an indication of the event on the display 111, and/or use a remote communication device (such as a pager radio or power line modem), not shown, to transmit a signal containing an indication of the event to a remote source.

Referring again to the processor 112a, it has been mentioned above that the processor 112a can take as much as a second or more to transition from the sleep mode to the active mode and process the input signals at the inputs 218 and 624. Accordingly, there is a possibility that the cover 162 would be removed, and then replaced before the processor 112a can transition to the active mode and process the value at the input 624. In such a situation, however, the latch 712 operates to hold the latched output signal at the output 710 at a low state for a sufficient time to allow the processor 112a to transition to the active state and process the value at the input 624. To this end, the capacitor 724 retains sufficient charge to hold the semiconductor switch 722 in the "on" state for at least the time associated with the transition of the processor 112a to the on-state (and whatever additional time is required to detect the value at the input 624). In such a case, even though the switch 620 may be open when the processor 112a processes the input signal at the input 624, the processor 112a still receives the low logic signal at the input 624 because the capacitor 724 has held the semiconductor switch 722 in the conducting state temporarily even though no voltage is present on the second conductor 621b.

As a consequence, quick removal and replacement of the meter cover 162, even when the primary power to the meter 100' is absent, may be detected, recorded, displayed and/or communicated. Moreover, it will be appreciated that the pulse circuit 416 helps the processor 112a detect a closing of the switch 620 by enabling the processor 112a to detect another transition at the first input 220 even when the magnetic switch 120 is closed. In particular, because closure of the magnetic switch 120 only causes a pulse output, as opposed to a constant high logic level output at the first input 220, the processor 112a can still detect a transition at the first input 220 caused by closure of the magnetic switch 620 due to tampering, even when the magnetic switch 120 remains closed.

Figure 8:
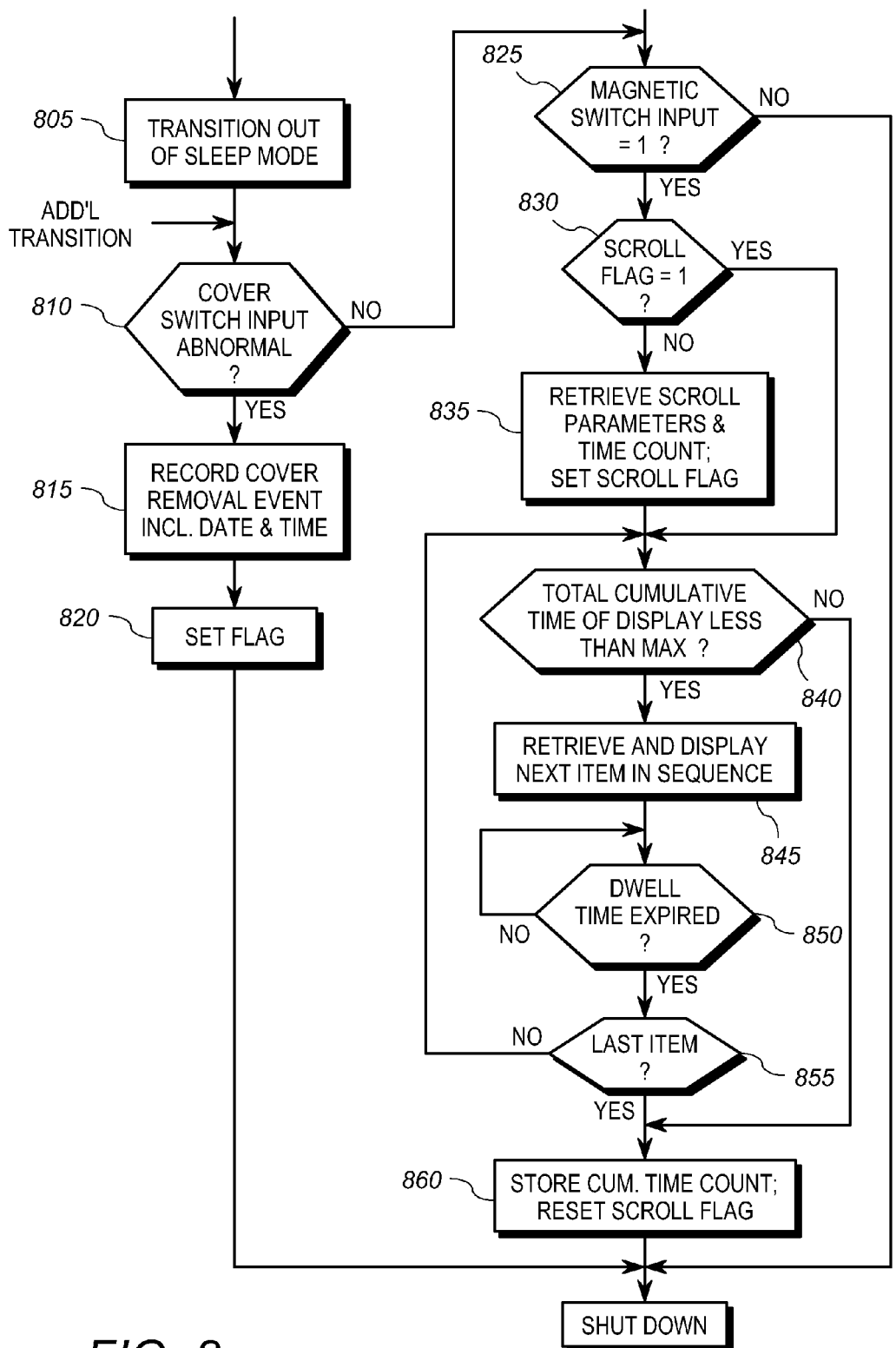
FIG. 8 shows a flow diagram of an exemplary set of operations of a processor of the meter of FIG. 6 when power is absent from the primary power supply of the meter.

In particular, FIG. 8 shows a set of operations that may be commenced by the processor 112a when it is in sleep mode. In general, during the sleep mode, the processor 112a only maintains a real time clock, and monitors for a transition in the signal at its first input 220. The operations of FIG. 8 are only triggered when the processor 112a detects a positive transition in the signal at the first input 220.

Accordingly, in step 805, the processor 112a has detected the transition at the first input 220 during sleep mode. In step 805, the processor 112a transitions out of the sleep mode into a mode in which further programming instructions of FIG. 8 may be executed. To this end, as discussed above, during the sleep mode, the microprocessor does not execute any instructions, and only the real time clock is running to maintain the power consumption to its minimum. To transition out of sleep mode (due to a positive transition received at the first input 220), the microprocessor requires "warm up time" to turn on its internal oscillator circuit, wait time for the oscillator circuit to stabilize, turn on the CPU, turn on appropriate peripherals, IOs, etc. This process may take up to 1 second. Once the processor 112a has transitioned from the sleep mode to an active "third" mode in which programming instructions may be executed, the processor 112a proceeds to step 810.

In addition, if the processor 112a detects the transition at the input 220 while already executing the steps of FIG. 8, then the processor 112a proceeds directly to step 810. To this end, the processor 112a continues to monitor for transitions at the first input 220 during the third mode, and upon detection of a transition, proceeds directly to step 810.

In steps 810, the processor 112a identifies whether the signal at the third input 624 is in a logic state that indicates that the switch 620 is or has been closed within the last few moments (i.e. via operation of the latch circuit 712 of FIG. 7). In this embodiment, the processor 112a determines that the switch 620 is or has been recently closed if the signal at the input 624 is at the low logic level. If the signal at the input 624 is at the low logic signal level (indicating a switch 620 closure), then the processor 112a proceeds to step 815. If the signal at the input 624 is at the high logic level (indicating no switch 620 closure), then the processor 112a proceeds instead to step 825.

In step 815, the processor 112a records a mechanical switch event record in the memory 106. The event record includes the time and date of the event, as well as an identification of the event. The processor 112a proceeds to step 820. In step 820, the processor 112a sets a flag indicating that an event has occurred. The processor 112a may later use the flag as a trigger, when fully powered up (for normal metering operation), to display an indication of the cover removal event on the display 111, and/or communicate it using a meter communication circuit. After setting the flag, the processor 112a proceeds to shut down and return to sleep mode.

Accordingly, steps 815 and 820 indicate the operations that occur when the processor 112a detects a transition at the input 220 resulting from a closure of the switch 620. As discussed above, if processor 112a determines from the input 624 that the transition at the input 220 is not associated with the closure of the switch 620, then the processor 112a proceeds to step 825. In step 825, the processor 112a determines whether the input 218 indicates that the magnetic switch 120 has been closed. If not, then the processor 112a shuts down and returns to sleep mode, as there is no indication of how the transition at the input 220 occurred.

If, however, in step 825 the processor 112a determines that the signal at the input 218 is at a high logic level (indicating a closure of the switch 120), the processor 112a proceeds to step 830. In step 830, the processor 112a determines whether the scroll flag has already been set. As will be discussed below, the scroll flag indicates whether the processor 112a was already executing the steps of FIG. 8.

If the scroll flag has already been set, then the processor 112a proceeds to step 840. If not, however, then the processor 112a first executes step 835. In step 835, the processor 112a retrieves display parameters from the memory 106. The display parameters identify the sequence of metering values that are to be displayed. To this end, it will be appreciated that the memory 106 stores several metering values that were stored to the memory 106 when the power outage occurred. These values may be displayed in sequence on the display 111. The memory 106 furthermore stores parameters as to which of the stored values will be displayed, and in what order. Also in step 835, the processor 112a obtains timing from the memory 106. The timing information is an accumulated count or measure of time time_count representative of the total time of display since the beginning of the present power outage. Furthermore, the processor 112a sets the scroll flag=1. While the scroll flag is set, the processor 112a adds to time_count, based on the internal clock, on an ongoing basis. In any event, after step 835, the processor 112a proceeds to step 840.

In step 840, the processor 112a determines if the value of time_count, which represents the total cumulative time of display, is below a predetermined threshold value. In particular, in order to ensure that the secondary power source 126 is not overused, the processor 112a allows for the display operation to take place only for a limit time. Accordingly, as long as time_count is below the threshold, the power outage display operation may continue. Otherwise, the processor 112a shuts down. In any event, if the processor 112a determines that time_count is below the threshold, then the processor proceeds to step 845. If time_count exceeds the threshold, then the processor 112a proceeds to step 860.

In step 845, the processor 112a retrieves from the memory 106 the next value to be displayed, as defined by the retrieved scroll parameters, and causes the value to be displayed on the display 111. The processor 112a then proceeds to step 850. In step 850, the processor 112a determines whether the dwell time of the display of the current value on the display 111 has expired. If not, then the processor 112a returns to step 850. If so, however, then the processor 112a proceeds to step 855. In step 855, the processor 112a determines whether the current metering value being displayed is the last according to the parameters retrieved in step 835. If so, then the processor 112a proceeds to step 860. If not, then the processor 112a returns to step 840 and proceeds accordingly to display the next value in the defined sequence.

In step 860, the processor 112a stores the time_count value in the memory 106, and resets the scroll flag to 0. The processor 112a thereafter shuts down and goes into the sleep mode.

Thus, FIG. 8 illustrates some of the features of this embodiment in displaying metering information during a power outage. Firstly, the values are displayed in a sequence defined by display or scroll parameters stored in the memory 106. This allows the utility or other party to customize the sequence of values that are allowed to be displayed during power outage, by storing the parameters in memory 106. Secondly, while the display during power outage operation may be done repeatedly, the total accumulated display time during a single power outage may not exceed a predetermined threshold. This helps conserve energy in the secondary power source 126 for maintaining the clock and monitoring for tampering. Thirdly, this embodiment allows the user to rapidly scroll through the display sequence by repeated opening and closing of the magnetic switch 120 (by alternately placing and removing the magnetic device multiple times). To this end it will be appreciated that if the switch 120 and closed again, the processor 112*a* will detect the interrupt at the first input 218, and then perform steps 610, 625 and 630 again. However, in step 830, the processor 112*a* will determine that the flag had already been set and skips forward to step 840 to move to the next value to be displayed.

Yet another feature of the embodiment of FIGS. 7 and 8 is the processor 112*a* can detect a meter cover event even while performing display operations in steps 825-860.

It will be appreciated that the above described embodiments are merely illustrative, and that those of ordinary skill in the art may readily devise their own implementations and modifications that incorporate the principles of the present invention and fall with within the spirit and scope thereof.

What is claimed is:

1. A circuit arrangement for use in a utility meter;
a processing circuit having a first mode and a second mode, and a least a first input and a second input, the processing circuit configured to perform a first set of metering operations related to energy metering in the first mode, and a second set of operations in the second mode, the second set of operations having fewer operations than the first set of operations, the processing circuit consuming less power in the second mode than in the first mode;
a magnetically-actuated switch having a first state and a second state, the switch operably coupled to provide a first output signal to the second input of the processing circuit;
a first circuit operably coupled to the magnetically-actuated switch, the first circuit configured generate a pulse signal responsive to the magnetically-actuated switch transitioning from the first state to the second state, the first circuit further operably coupled to provide the pulse signal to the first input of the processing circuit;
wherein the processing circuit is configured to cause display of stored values responsive to receiving the pulse signal at the first input in the second mode and receiving the first output signal at the second input.

2. The circuit arrangement of claim 1, wherein the first circuit comprises at least one capacitor serially coupled between the magnetically-actuated switch and the first input.

3. The circuit arrangement of claim 1, wherein the processing circuit includes a third input and is further configured to:
cause storage of an indication of an event responsive to receiving a positive transition at the first input in the second mode and receiving a second output signal at the third input.

4. The circuit arrangement of claim 1, wherein the processing circuit is further configured to:
transition from the second mode to a third mode responsive to the pulse signal at the first input; and
display the stored values in the third mode responsive to the first output signal at the second input.

5. The circuit arrangement of claim 4, further comprising a memory, and wherein the processing circuit is further configured to, in the third mode:
retrieve a set of stored parameters from the memory, the set of stored parameters defining a sequence of values to display; and
display the stored values in the defined sequence in the set of stored parameters.

6. The circuit of arrangement of claim 4, wherein the processing circuit is further configured to:
track and store accumulated time within the third mode;
determine whether the accumulated time exceeds a predetermined threshold; and
transition from the third mode to the second mode if the accumulated time exceeds the predetermined threshold.

7. The circuit arrangement of claim 1, further comprising a non-volatile memory containing the stored values, and wherein the processing circuit is operably connected to the non-volatile memory.

8. The circuit arrangement of claim 7, wherein the stored values include metering values.

9. The circuit arrangement of claim 1, further comprising a power supply and secondary power source, and wherein the processing circuit is configured to transition from the first mode to the second mode responsive to the power supply failing to provide output power to the processing circuit.

10. The circuit arrangement of claim 1, wherein the second set of operations comprises maintaining a clock.

11. A circuit arrangement for use in a utility meter;
a processing circuit having a first mode and a second mode, the processing circuit configured to operate in the first mode when receiving bias power from a primary power supply, and to operate in the second mode when receiving bias power from a secondary power source, the processing circuit configured to consume less power in the second mode than in the first mode;
a magnetically-actuated switch having a first state and a second state, the switch operably coupled to provide a first output signal to the processing circuit;
a first circuit operably coupled to the magnetically-actuated switch, the first circuit configured generate a pulse signal responsive to the magnetically-actuated switch transitioning from the first state to the second state, the first circuit further operably coupled to provide the pulse signal to the processing circuit;
wherein the processing circuit is configured to cause display of stored values responsive to receiving the pulse signal in the second mode and receiving the first output signal.

12. The circuit arrangement of claim 11, wherein the first circuit comprises at least one capacitor serially coupled between the magnetically-actuated switch and the processing circuit.

13. The circuit arrangement of claim 11, wherein the processing circuit includes is further configured to:
cause storage of an indication of an event responsive to receiving a positive transition in the second mode and receiving a second output signal.

14. The circuit arrangement of claim 11, wherein the processing circuit is further configured to:
transition from the second mode to a third mode responsive to the pulse signal; and
display the stored values in the third mode responsive to receiving the first output signal.

15. The circuit arrangement of claim 14, further comprising a memory, and wherein the processing circuit is further configured to, in the third mode:
retrieve a set of stored parameters from the memory, the set of stored parameters defining a sequence of values to display; and display the stored values in the defined sequence in the set of stored parameters.

16. The circuit of arrangement of claim 14, wherein the processing circuit is further configured to:
    track and store accumulated time within the third mode;
    determine whether the accumulated time exceeds a predetermined threshold; and
    transition from the third mode to the second mode if the accumulated time exceeds the predetermined threshold.

17. The circuit arrangement of claim 16, wherein the stored values include metering values.

18. A circuit arrangement for use in a utility meter;
    a processing circuit having a first mode and a second mode, the processing circuit configured to operate in the first mode when receiving bias power from a primary power supply, and to operate in the second mode when receiving bias power from a secondary power source, the processing circuit configured to consume less power in the second mode than in the first mode;
    a switch having a first state and a second state, the switch operably coupled to provide at least one output signal to the processing circuit;
    wherein the processing circuit is configured to:
        transition from the second mode to a third mode responsive at least in part to receiving the at least one output signal in the second mode;
        display the stored values in the third mode;
        track and store accumulated time within the third mode;
        determine whether the accumulated time exceeds a predetermined threshold; and
        transition from the third mode to the second mode responsive a determination that the accumulated time exceeds the predetermined threshold.

19. The circuit arrangement of claim 18, further comprising a memory, and wherein the processing circuit is further configured to, in the third mode:
    retrieve a set of stored parameters from the memory, the set of stored parameters defining a sequence of values to display; and
    display the stored values in the defined sequence in the set of stored parameters.

20. The circuit arrangement of claim 19, wherein the processing circuit is further configured to, in the third mode, retrieve the accumulated time from the memory and store the accumulated time to the memory.

* * * * *